(12) United States Patent
Hamada

(10) Patent No.: US 8,153,334 B2
(45) Date of Patent: Apr. 10, 2012

(54) METHOD FOR STRIPPING PELLICLE AND STRIPPING APPARATUS USED THEREIN

(75) Inventor: Yuichi Hamada, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 95 days.

(21) Appl. No.: 12/434,876

(22) Filed: May 4, 2009

(65) Prior Publication Data

US 2009/0286168 A1    Nov. 19, 2009

(30) Foreign Application Priority Data

May 13, 2008    (JP) ................................ 2008-125378

(51) Int. Cl.
*G03F 1/00*    (2012.01)
(52) U.S. Cl. ............................................ 430/5; 430/394
(58) Field of Classification Search ............... 430/5, 394
See application file for complete search history.

(56) References Cited

U.S. PATENT DOCUMENTS

| | | | | |
|---|---|---|---|---|
| 5,616,927 | A | 4/1997 | Kubota et al. | 250/492.2 |
| 2004/0091796 | A1* | 5/2004 | Nagata | 430/5 |
| 2006/0257754 | A1* | 11/2006 | Harubayashi et al. | 430/5 |
| 2008/0063952 | A1* | 3/2008 | Shirasaki | 430/5 |

FOREIGN PATENT DOCUMENTS

| | | |
|---|---|---|
| EP | 0788028 A2 | 8/1997 |
| JP | 8-76361 | 3/1996 |
| JP | 2000-305252 | 11/2000 |

OTHER PUBLICATIONS

European Search Report dated Feb. 16, 2010.
Chinese Office Action mailed Feb. 24, 2011, in counterpart Chinese Patent Application No. 200910139179.8, with Partial English Translation.

* cited by examiner

*Primary Examiner* — Mark F Huff
*Assistant Examiner* — Rashid Alam
(74) *Attorney, Agent, or Firm* — Kratz, Quintos & Hanson, LLP

(57) ABSTRACT

A method for stripping a pellicle from an exposure master plate is provided, the pellicle being a lithographic pellicle that includes a pellicle frame, a pellicle film stretched over one end face of the pellicle frame via a pellicle film adhesive, and an exposure master plate pressure-sensitive adhesion layer provided on the other end face, the method including a step of irradiating the pressure-sensitive adhesion layer with UV light. There is also provided a stripping apparatus used in the stripping method, the apparatus including a light source for irradiating the exposure master plate pressure-sensitive adhesion layer with UV light and means for heating the exposure master plate and/or the pellicle frame with which the pressure-sensitive adhesion layer is in contact.

10 Claims, 2 Drawing Sheets

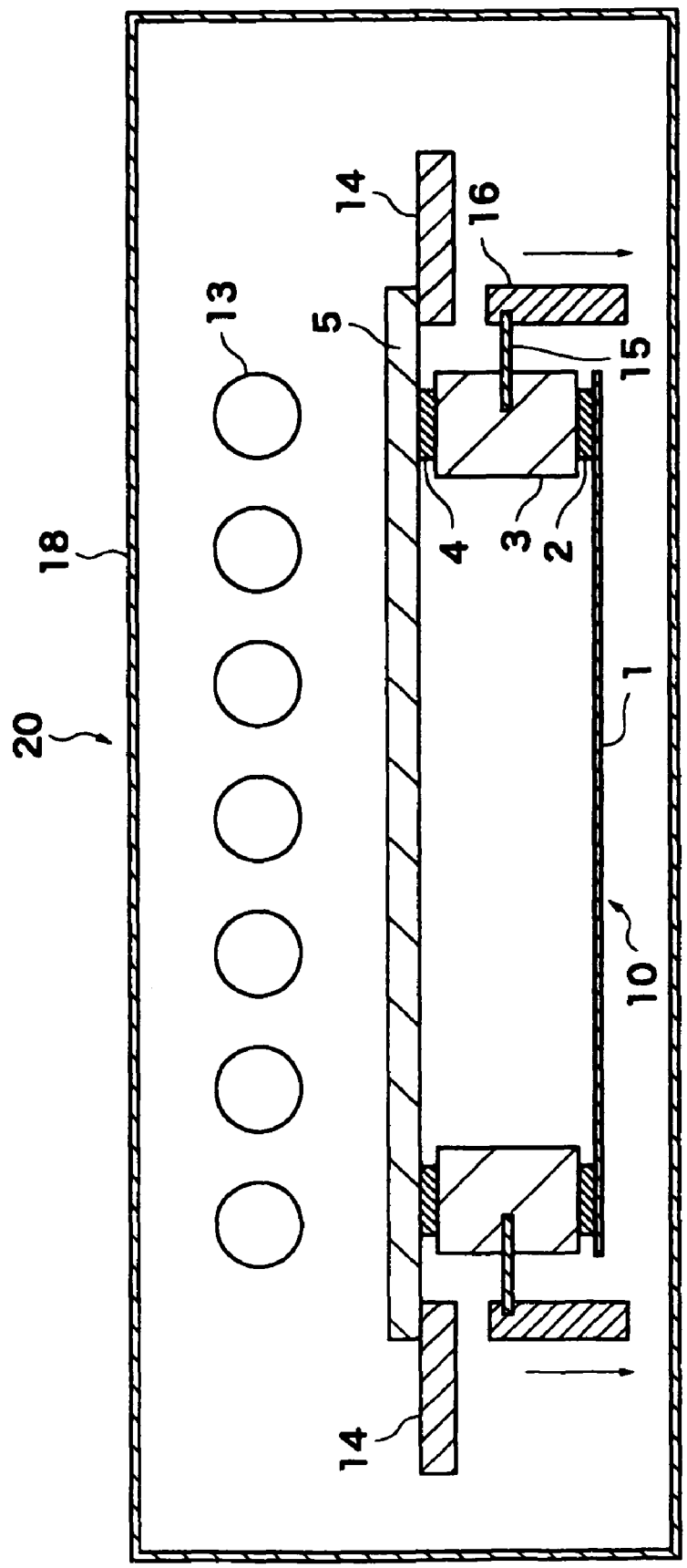

METHOD FOR STRIPPING PELLICLE AND STRIPPING APPARATUS USED THEREIN

BACKGROUND OF THE INVENTION

1. Field of the Invention

The present invention relates to a method for stripping a lithographic pellicle that is used as a debris shield for a lithographic mask when producing a liquid crystal display panel or a semiconductor device such as an LSI or a ULSI, and a stripping apparatus used therein.

2. Description of the Related Art

In the production of a semiconductor such as an LSI or a VLSI or the production of a liquid crystal display panel, a pattern is formed by irradiating a semiconductor wafer or a liquid crystal substrate with light through an exposure master plate; if debris is attached to the exposure master plate used here, since the debris absorbs the light or bends the light, there are the problems that the replicated pattern is deformed, the edge becomes rough, or the background is stained black, thus impairing the dimensions, quality, appearance, etc. The 'exposure master plate' referred to in the present invention is a general term for lithographic masks and reticles.

These operations are usually carried out in a clean room, but even within a clean room it is difficult to always keep the exposure master plate clean, and a method is therefore employed in which a pellicle that allows exposure light to easily pass through is adhered to the surface of the exposure master plate to act as a debris shield.

In this case, the debris does not become attached directly to the surface of the exposure master plate but becomes attached to the pellicle film, and by focusing on a pattern of the exposure master plate when carrying out lithography the debris on the pellicle film does not become involved in the replication.

The pellicle is basically constituted from a pellicle frame and a pellicle film stretched over the frame. The pellicle film is formed from nitrocellulose, cellulose acetate, a fluorine-based polymer, etc., which allows exposure light (g rays, i rays, 248 nm, 193 nm, 157 nm, etc.) to easily pass through. The pellicle frame is formed from a black-anodized etc. A7075, A6061, A5052, etc. aluminum alloy, stainless steel, polyethylene, etc. The pellicle film is adhered by coating the upper part of the pellicle frame with a good solvent for the pellicle film and air-drying or by means of an adhesive such as an acrylic resin, an epoxy resin, or a fluorine resin. Furthermore, since an exposure master plate is mounted on a lower part of the pellicle frame, a pressure-sensitive adhesion layer made of a polybutene resin, a polyvinyl acetate resin, an acrylic resin, a silicon resin, etc. and a reticle pressure-sensitive adhesive protecting liner for the purpose of protecting the pressure-sensitive adhesion layer are provided.

The pellicle is installed so as to surround a pattern region formed on the surface of the exposure master plate. Since the pellicle is provided in order to prevent debris from becoming attached to the exposure master plate, this pattern region and a pellicle outer part are separated so that dust from the pellicle outer part does not become attached to the pattern face.

In recent years, the LSI design rule has shrunk to sub-quarter micron, and accompanying this the wavelength of an exposure light source is being shortened, that is, instead of g rays (436 nm) and i rays (365 nm) from the hitherto predominant mercury lamp, a KrF excimer laser (248 nm), an ArF excimer laser (193 nm), an $F_2$ laser (157 nm), etc. are being used. When the wavelength of exposure light becomes shorter, the energy of the exposure light naturally becomes high. When high energy light such as an excimer laser is used, compared with the light of conventional g rays or i rays, the possibility that gaseous material present in the exposure atmosphere will react so as to form foreign matter on the exposure master plate becomes extremely high. Because of this, countermeasures such as minimizing gaseous material within a clean room, carrying out rigorous washing of a reticle, and removing gas-generating substances from materials forming a pellicle have been taken.

In particular, since the pellicle is used by affixing it directly to an exposure master plate, there is a desire for a low gas generation rate for materials forming the pellicle, that is, a reticle adhesive, a film adhesive, an inner wall coating agent, etc., which are formed from organic materials, and improvements have been made. Among them, as the reticle adhesive there is one that employs a silicone resin in order to give lower outgassing, improved UV resistance, and improved chemical resistance. Since silicone resins have excellent chemical stability, it is possible to fix a pellicle onto a reticle without there being any changes over a long period of time. However, when the pellicle is to be stripped from the reticle for replacement, it is difficult to carry out stripping well without leaving a residue on the reticle. As a method for stripping a pellicle that has a silicone adhesive, a method in which a substrate from which a pellicle is stripped is heated has been proposed (JP-A-2000-305252 (JP-A denotes a Japanese unexamined patent application publication.)).

BRIEF SUMMARY OF THE INVENTION

However, even utilizing the heating method, it is very difficult to strip a pellicle affixed to a reticle that has been subjected to ArF irradiation for a given period of time due to the silicone resin being partially oxidized. Since a pressure-sensitive adhesive is hardly changed by KrF irradiation, there are no changes that inhibit the ease of stripping.

Compared with a normal acrylic adhesive or a SEBS-based adhesive, washing of a silicone resin pressure-sensitive adhesive residue remaining on an exposure master plate after stripping is extremely difficult due to very high acid resistance.

The present invention has been accomplished in order to solve the above-mentioned problems. That is, it is an object of the present invention to provide a method for stripping a pellicle that enables a used pellicle to be easily stripped from an exposure master plate and that can prevent recontamination of the exposure master plate by pressure-sensitive adhesive residue after stripping, and a stripping apparatus used in this method.

The above-mentioned object of the present invention has been attained by means (1) and (9) below.

(1) A method for stripping a pellicle from an exposure master plate, the pellicle being a lithographic pellicle comprising a pellicle frame, a pellicle film stretched over one end face of the pellicle frame via a pellicle film adhesive, and an exposure master plate pressure-sensitive adhesion layer provided on the other end face, wherein the method comprises a step of irradiating the pressure-sensitive adhesion layer with UV light, (2) the method for stripping a pellicle according to (1), wherein the UV light has spectral energy with a wavelength of no greater than 200 nm, (3) the method for stripping a pellicle according to (1) or (2), wherein the pressure-sensitive adhesion layer is a layer comprising a silicone pressure-sensitive adhesive, (4) the method for stripping a pellicle according to any one of (1) to (3), wherein it comprises a step of heating the exposure master plate and/or the pellicle frame with which the pressure-sensitive adhesion layer is in contact, (5) the method for stripping a pellicle according to (4), wherein the heating temperature for the pressure-sensitive adhesion layer is at least 40° C. but no greater than 150° C., (6) the method for stripping a pellicle according to any one of (1) to (5), wherein irradiation with UV light is carried out while applying a load to the pellicle in a direction in which the exposure master plate and the pellicle frame are stripped apart, (7) the method for stripping a pellicle according to (6), wherein the load applied to the pellicle is the self-weight of the pellicle in the direction of gravity, (8) the method for stripping a pellicle according to any one of (1) to (7), wherein the pellicle is stripped from the exposure master plate after a step of exposure by an ArF excimer laser through the exposure master plate, (9) a stripping apparatus used in the stripping method according to (1), the apparatus comprising a light source for irradiating the exposure master plate pressure-sensitive adhesion layer with UV light, and means for heating the exposure master plate and/or the pellicle frame with which the pressure-sensitive adhesion layer is in contact, and

(10) the stripping apparatus according to (9), wherein it further comprises means for applying a load to the pellicle in a direction in which the exposure master plate and the pellicle frame are stripped apart.

BRIEF DESCRIPTION OF THE DRAWINGS

FIG. 3 is a schematic diagram showing the constitution of a stripping apparatus of the present invention.

BEST MODE FOR CARRYING OUT THE INVENTION

The method for stripping a pellicle of the present invention is a method for stripping from an exposure master plate a lithographic pellicle comprising a pellicle frame, a pellicle film stretched over one end face of the pellicle frame via a pellicle film adhesive, and an exposure master plate pressure-sensitive adhesion layer provided on the other end face, wherein the method comprises a step of irradiating the pressure-sensitive adhesion layer with UV light.

After outlining the pellicle used in the present invention, a method for stripping a pellicle is explained in detail below.

Figure 1:
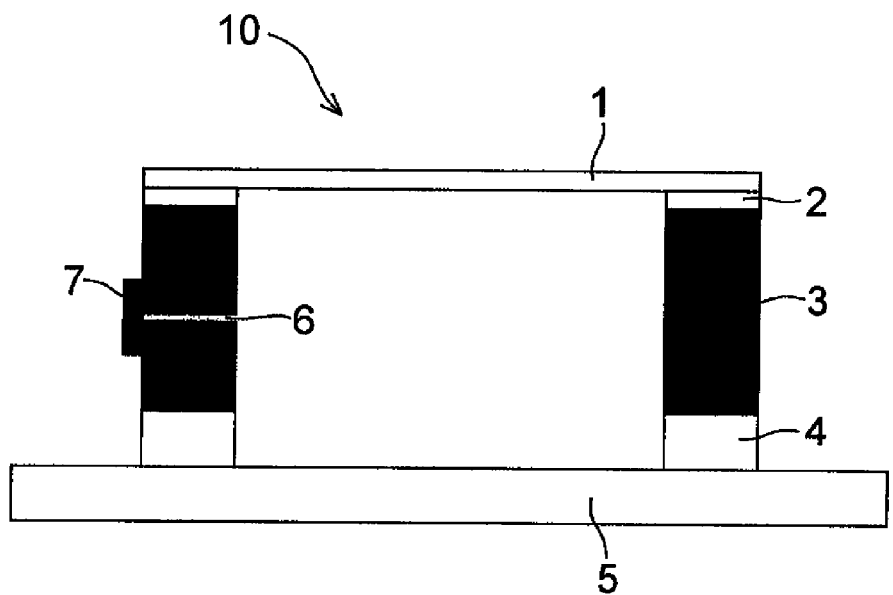
FIG. 1 is a schematic diagram showing the basic constitution of a pellicle used in the present invention.
Figure 2:
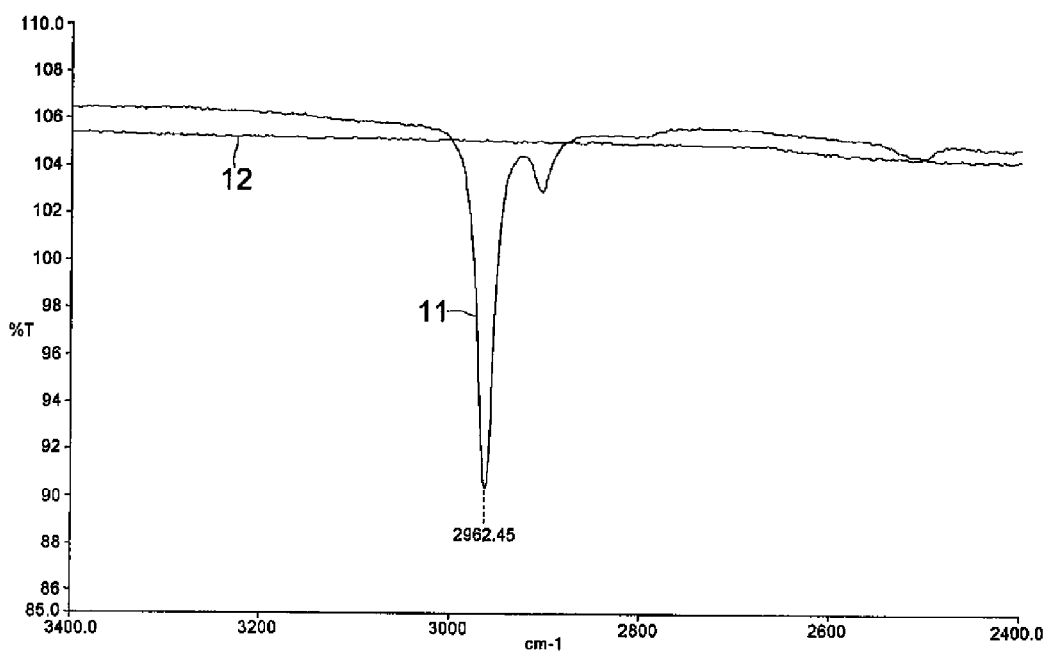
FIG. 2 is an IR absorption spectral chart showing changes in absorption in the C—H bond region accompanying UV irradiation.

The basic constitution of the pellicle used in the present invention is explained first by reference to FIG. 1.

As shown in FIG. 1, a pellicle 10 of the present invention is formed by stretching a pellicle film 1 over an upper end face of a pellicle frame 3 via an adhesive layer 2 for affixing the pellicle film. In this case, a pressure-sensitive adhesion layer 4 for adhering the pellicle 10 to an exposure master plate (mask substrate or reticle) 5 is usually formed on a lower end face of the pellicle frame 3, and a liner (not illustrated) is detachably adhered to a lower end face of the pressure-sensitive adhesion layer 4. The pellicle frame 3 may be provided with an atmospheric pressure adjustment hole (vent) 6, and further with a dust filter 7 for the purpose of removing particles.

In this case, the dimensions of these pellicle constituent members are similar to those of a normal pellicle, for example, a pellicle for semiconductor lithography, a pellicle for a lithographic step of large liquid crystal display panel production, etc., and the materials thereof may be known materials, as described above.

The type of pellicle film is not particularly limited and, for example, an amorphous fluorine polymer, etc. that has conventionally been used for an excimer laser is used. Examples of the amorphous fluorine polymer include Cytop (product name, manufactured by Asahi Glass Co. Ltd.) and Teflon (Registered Trademark) AF (product name, manufactured by DuPont). These polymers may be used by dissolving them in a solvent as necessary when preparing the pellicle film, and may be dissolved as appropriate in, for example, a fluorine-based solvent.

With regard to the base material of the pellicle frame, a conventionally used aluminum alloy material, and preferably a JIS A7075, JIS A6061, JIS A5052 material, etc., is used, but when an aluminum alloy is used it is not particularly limited as long as the strength as a pellicle frame is guaranteed. The surface of the pellicle frame is preferably roughened by sandblasting or chemical abrasion prior to providing a polymer coating. In the present invention, a method for roughening the surface of the frame may employ a conventionally known method. It is preferable to employ a method for roughening the surface involving blasting the aluminum alloy material surface with stainless steel, carborundum, glass beads, etc., and further by chemically abrading with NaOH, etc.

An adhesive used in the pressure-sensitive adhesion layer 4 may appropriately be selected from various types of adhesives; an acrylic adhesive, a SEBS-based adhesive, and a silicone-based adhesive may preferably be used, and a silicone-based adhesive may more preferably be used. When a silicone-based adhesive is used, a residue on a substrate after a pellicle is stripped from a reticle by UV irradiation can be removed well by conventional substrate washing.

When a silicone resin is used as a reticle pressure-sensitive adhesion layer, due to this resin having high light resistance it is necessary to use a higher level of UV irradiation than in a case of the above adhesives. Furthermore, since the pressure-sensitive adhesive residue after stripping is almost completely oxidized by UV light, there is hardly any possibility of spread of contamination as there is for a silicone stripping residue that has not had UV irradiation.

The method for stripping a pellicle of the present invention is explained by reference to a specific example in which a pellicle is stripped from a reticle.

After ArF irradiation, a reticle having a pellicle affixed thereto is set horizontally so that a pellicle attachment face is on the lower side of the reticle. A UV irradiation light source for stripping is disposed such that irradiation is possible from the side opposite to the pellicle attachment face of the reticle.

Furthermore, the design is preferably such that the intensity of UV light for irradiation is at least 1 W/cm$^2$ on the irradiation face.

The UV light preferably has a spectral energy with a wavelength of no greater than 200 nm, and is more preferably UV light having a spectral energy of 150 to 200 nm. Examples of light sources having a component in this wavelength region include an ArF excimer laser (193 nm), an $F_2$ laser (157 nm), a YAG solid laser light source, and a low-pressure mercury lamp (185 nm, 254 nm).

When carrying out a stripping operation in practice, a reticle having a pellicle affixed thereto is set in a stripping apparatus such that the pellicle attachment face is on the lower side of the reticle. Subsequently, a UV light source of this apparatus is switched on, and the pressure-sensitive adhesion layer of the pellicle is irradiated with UV light until the pellicle falls under its own weight.

In the present invention, when carrying out the stripping operation, it is preferable to heat the pressure-sensitive adhesive layer. This heating step may be at the same time as or before or after UV light irradiation, and it is preferable to carry it out at the same time. Heating is preferably carried out by a method in which an exposure master plate and/or a pellicle frame with which the pressure-sensitive adhesion layer is in contact are heated, and it is more preferable to heat the exposure master plate. As a specific method, any of a method involving radiant heat of a high temperature body such as a hot air dryer, an IR lamp, or a hot plate, a method involving heat conduction by contact with a high temperature body such as a hot plate, a method in which an induction current is passed through a frame by utilizing high-frequency induction heating without making contact with the pressure-sensitive adhesive layer to thus heat only the frame efficiently, thereby indirectly heating the pressure-sensitive adhesive layer, etc. are possible. In a preferred stripping method of the present invention, when a pellicle is stripped from a reticle, stripping is carried out in a state in which a pressure-sensitive adhesive layer between the pellicle and the reticle is heated, and the heating temperature for the pressure-sensitive adhesion layer is preferably 40° C. to 150° C., more preferably 50° C. to 120° C., and particularly preferably 60° C. to 120° C. When in the above-mentioned heating temperature range, the pressure-sensitive adhesive is sufficiently softened, and it is possible to carry out stripping smoothly; it is also possible to prevent the pressure-sensitive adhesive from remaining as an adhesive residue on the reticle surface. The heating temperature can be controlled by detection using, for example, a thermistor thermometer.

In a method for stripping a pellicle from an exposure master plate, the pellicle may be stripped by heating a pressure-sensitive adhesive layer between the exposure master plate and the pellicle to 40° C. to 150° C. by means of the above-mentioned radiant heat from a high temperature body, heat conduction by contact with a high temperature body, high-frequency induction heating, etc. while irradiating the pressure-sensitive adhesion layer with UV light or after irradiation with UV light, and as necessary by slowly pulling from a long or short side of the frame.

In the stripping method of the present invention, it is preferable to apply a load in a direction in which the exposure master plate and the pellicle frame are stripped apart. A force that pulls up the pellicle frame of the pellicle placed above the exposure master plate may be applied, or a force that pulls down in the vertical direction the pellicle frame of the pellicle placed beneath the exposure master plate may be applied. The size of the load may be appropriately selected, but is preferably 0.1 to 2 kgw, and more preferably 0.2 to 1.5 kgw. Application of a load may be carried out by means of weights using, for example, four JIG holes placed in the pellicle longer sides in a direction in which the pellicle and the exposure master plate are stripped apart. A load in the above-mentioned range is preferably applied while heating at a temperature in the above-mentioned heating range. In addition, in a step of irradiating a pressure-sensitive adhesive with UV light, the temperature of the pressure-sensitive adhesive is also increased by heat radiated from a light source. When the exposure master plate pressure-sensitive adhesive is not directly irradiated with UV light due to the presence of a mask image of the exposure master plate, it is preferable to employ the above-mentioned application of load or employ application of load and heating in combination.

When it is necessary to apply a force to pull upward or a force to strip laterally, it is possible to change the direction of the force of a weight using a pulley as appropriate.

Furthermore, when the exposure master plate pressure-sensitive adhesive can be directly irradiated with UV light due to the absence of an exposure master plate mask image, an arrangement in which the pellicle is on the lower side of the exposure master plate and the load to be applied is the self-weight (about 30 g) of the pellicle is also preferable.

The stripping method of the present invention may preferably be used when there is no Cr mask on an exposure master plate at the position where a pellicle is affixed so that it is transparent, and in such a case UV light is applied from the opposite side of the exposure master plate to the face where the pellicle is affixed. Furthermore, it may be preferably used as a method for stripping a pellicle after imagewise exposure is carried out by an ArF excimer laser.

After stripping the pellicle, the reticle is washed again in a washing step, and after completing an inspection step a new pellicle is affixed for use.

Referring to FIG. 3, a stripping apparatus of the present invention is explained below.

A stripping apparatus 20 of the present invention is an apparatus that is used in the above-mentioned stripping method, and comprises a light source 13 for irradiating with UV light a pressure-sensitive adhesion layer 4 via which a pellicle 10 is affixed to an exposure master plate 5, the pellicle 10 having a pellicle film 1 stretched over a pellicle frame 3 via an adhesion layer 2. This stripping apparatus preferably comprises means for heating the exposure master plate 5 and/or the pellicle frame 3 with which the pressure-sensitive adhesion layer 4 is in contact. Furthermore, it may comprise a plurality of light sources 13 so as to also function as a heating source.

Furthermore, in the stripping apparatus 20, the exposure master plate 5 is fixed by an exposure master plate fixing stage 14, and the stripping apparatus 20 preferably further comprises load application means 16 that applies a load in a direction in which the exposure master plate 5 and the pellicle frame 3 are stripped apart. Application of a load may utilize a support post 15 inserted into a JIG hole of the pellicle frame.

Moreover, since ozone is generated by irradiation with UV light of the light source 13, it is preferable to house the entire stripping apparatus within a chamber 20. The interior of the chamber 20 may be evacuated or flushed with an inert gas.

The heating means, the heating range, the load application means of this stripping apparatus, an application method of the apparatus, etc. are as explained for the stripping method above.

A method for stripping a pellicle that utilizes UV irradiation to an exposure master plate pressure-sensitive adhesion layer does not apply physical force to a pellicle or an exposure master plate, and there is therefore a very low possibility of breakage, etc. thereof. Furthermore, there is almost no possibility of contamination being spread by a pressure-sensitive adhesive residue on the exposure master plate surface when a pellicle is stripped. In particular, when the exposure master plate pressure-sensitive adhesion layer is a silicone adhesive, it is assumed that the adhesive residue on the reticle is almost completely oxidized by UV light and is in an inorganic state. Since the residue is also colorless and transparent and has a very thin film shape, it is possible to affix a pellicle to the same position without forcibly removing the residue.

Furthermore, the stripping apparatus of the present invention may be used effectively in the above-mentioned method for stripping a pellicle.

EXAMPLES

Example 1

The present invention is explained below more specifically by reference to Examples. A 'mask' in the Examples and Comparative Examples is illustrated as an example of the 'exposure master plate' and, needless to say, application to a reticle can be carried out in the same manner.

As a pellicle, a 6N2HF-AXN (Shin-Etsu Chemical Co., Ltd., reticle silicone pressure-sensitive adhesive) was prepared, and it was affixed to a 6 inch quartz mask substrate with a load of 25 kg for 2 minutes.

This substrate was irradiated with an ArF excimer laser from the side opposite to the pellicle attachment face with a total of 5 J/cm$^2$. This exposure is a simulation of light that falls on the pressure-sensitive adhesive as stray light during actual imagewise exposure.

The substrate after irradiation with the ArF excimer laser was set horizontally such that the pellicle attachment face was on the lower side.

Subsequently, irradiation with UV light at 185 nm was carried out by a low-pressure mercury lamp light source from the opposite side of the quartz mask substrate. The irradiation intensity of the UV light was 1.6 mW/cm$^2$ on the quartz substrate irradiation face. After about 5 hours of irradiation, the pellicle was stripped and fell from the quartz mask substrate. After the UV lamp was turned off, when the quartz mask substrate was checked, there was a band-shaped transparent residue on an area to which the pellicle had been affixed. When the thickness was measured using a profiler, it was found to be about 20 μm. Furthermore, when this residue was analyzed by IR, it was confirmed that the characteristic absorption (CH bond) of the silicone adhesive had disappeared.

When the substrate after stripping was subjected to a precision washing step, the band-shaped residue remained in that shape without moving or diffusing.

Example 2

As a pellicle, a 6N2HF-AXN (Shin-Etsu Chemical Co., Ltd., reticle silicone adhesive) was prepared, and it was affixed with a load of 25 kg for 2 minutes to a 6 inch quartz mask substrate that had been Cr vapor-deposited on half the area.

This quartz mask substrate was irradiated with an ArF excimer laser from the side opposite to the pellicle attachment face with a total of 5 J/cm$^2$.

The quartz mask substrate after irradiation with the ArF excimer laser was set horizontally such that the pellicle attachment face was on the lower side, and heated so that the substrate reached 80° C. A load of 1 kg was applied in the vertical direction, in which the pellicle was stripped from the substrate, using four JIG holes provided in the pellicle long sides.

Subsequently, irradiation with UV light at 185 nm was carried out by the same light source as above from the opposite side of the quartz mask substrate. The irradiation intensity of the UV light was 1.6 mW/cm$^2$ on the quartz mask substrate irradiation face. After about 5 hours of irradiation, the UV lamp was turned off, and it was confirmed that the pellicle had been stripped from the substrate. When the pressure-sensitive adhesive residue after stripping was checked, there was a band-shaped transparent residue on an area to which the pellicle had been affixed in a section where there was no Cr vapor-deposition. When the thickness was measured using a profiler, it was found to be about 20 μm. Furthermore, when this residue was analyzed by IR, it was similarly confirmed that the characteristic absorption (CH bond) of the silicone adhesive had disappeared. On the Cr vapor-deposited face, where UV light did not pass through, unlike the above there were two lines of pressure-sensitive adhesive residue, although the quantity was very small, along the inner edge and the outer edge of the area to which the pellicle had been affixed. When this residue was analyzed by IR, the same chart as that of the silicone reticle adhesive was obtained, and it was thus confirmed that the pressure-sensitive adhesive remained substantially unchanged.

When the substrate after stripping was subjected to a precision washing step, the band-shaped residue remained as it was without moving or diffusing. Furthermore, the pressure-sensitive adhesive residue on the Cr vapor-deposited face was removed well.

Comparative Example 1

As a pellicle, a 6N2HF-AXN (Shin-Etsu Chemical Co., Ltd., reticle silicone adhesive) was prepared, and it was affixed to a 6 inch quartz mask substrate with a load of 25 kg for 2 minutes.

This quartz mask substrate was irradiated with an ArF excimer laser from the side opposite to the pellicle attachment face with a total of 5 J/cm$^2$.

After irradiation with the ArF excimer laser, the quartz mask substrate was set horizontally such that the pellicle attachment face was on the lower side, and heated so that the substrate attained 80° C. A load of 1 kg was applied in a direction in which the pellicle was stripped from the substrate, using four JIG holes provided in the pellicle long sides.

Subsequently, irradiation with UV light at 254 nm was carried out from the opposite side of the substrate using an ozone-free low-pressure mercury lamp light source. The irradiation intensity of the UV light was 1.6 mW/cm$^2$ on the quartz substrate irradiation face. Since the pellicle had not been stripped after about 5 hours had elapsed, the load applied was increased, and when the load exceeded around 12 kg, it was finally stripped. When the pressure-sensitive adhesive residue after stripping was checked, a residue having a thickness, in parts, exceeding 300 μm was observed.

When this residue was analyzed by IR, the characteristic absorption (CH bond) of the silicone adhesive was present. It was observed that the above-mentioned adsorption had decreased slightly, but another absorption showing an Si—O bond had increased. This suggests that the silicone adhesive had been oxidized by ArF irradiation carried out after the pellicle had been affixed.

When the substrate after stripping was subjected to a precision washing step, the residue remained as it was in the area where the pressure-sensitive adhesive residue was present, and the surrounding area was newly contaminated as if a liquid had flowed.

EXPLANATION OF REFERENCE NUMERALS AND SYMBOLS

1: Pellicle film
2: Adhesion layer
3: Pellicle frame
4: Pressure-sensitive adhesion layer
5: Exposure master plate
6: Atmospheric pressure adjustment hole (vent)
7: Dust filter
10: Pellicle
13: UV light source
14: Exposure master plate fixing stage
15: Support post into JIG hole
16: Load application means
18: Chamber
20: Stripping apparatus 21: IR spectrum when silicone reticle pressure-sensitive adhesion layer was not irradiated with UV light
22: IR spectrum when silicone reticle pressure-sensitive adhesion layer was irradiated with UV light and fell.

What is claimed is:

1. A method for stripping a pellicle from an exposure master plate, the pellicle being a lithographic pellicle comprising a pellicle frame, a pellicle film stretched over one end face of the pellicle frame via a pellicle film adhesive, and an exposure master plate pressure-sensitive adhesion layer provided on the other end face, wherein the method comprises a step of irradiating the pressure-sensitive adhesion layer with UV light and the UV light has spectral energy with a wavelength of 150 nm to 200 nm,
the irradiation with UV light is carried out while applying a load to the pellicle in a direction in which the exposure master plate and the pellicle frame are stripped apart, and
the load is 0.1 to 2 kgw.

2. The method for stripping a pellicle according to claim 1, wherein the pressure-sensitive adhesion layer is a layer comprising a silicone pressure-sensitive adhesive.

3. The method for stripping a pellicle according to claim 1, wherein it comprises a step of irradiating with UV light while heating the exposure master plate and/or the pellicle frame with which the pressure-sensitive adhesion layer is in contact.

4. The method for stripping a pellicle according to claim 3, wherein the heating temperature for the pressure-sensitive adhesion layer is at least 40° C. but no greater than 150° C.

5. The method for stripping a pellicle according to claim 1, wherein the load is 0.2 to 1.5 kgw.

6. The method for stripping a pellicle according to claim 3, wherein irradiation with UV light is carried out while applying a load to the pellicle in a direction in which the exposure master plate and the pellicle frame are stripped apart.

7. The method for stripping a pellicle according to claim 1, wherein the load applied to the pellicle is the self-weight of the pellicle in the direction of gravity.

8. The method for stripping a pellicle according to claim 1, wherein the pellicle is stripped from the exposure master plate after a step of exposure by an ArF excimer laser through the exposure master plate.

9. A stripping apparatus used in the stripping method according to claim 1, the apparatus comprising:
a light source for irradiating the exposure master plate pressure-sensitive adhesion layer with UV light; and
means for heating the exposure master plate and/or the pellicle frame with which the pressure-sensitive adhesion layer is in contact.

10. The stripping apparatus according to claim 9, wherein it further comprises means for applying a load to the pellicle in a direction in which the exposure master plate and the pellicle frame are stripped apart.

* * * * *